US012628444B2

(12) United States Patent
Lee

(10) Patent No.: US 12,628,444 B2
(45) Date of Patent: May 12, 2026

(54) MEDIA FOR STORING MULTISPECTRAL IMAGE AND FABRICATION METHOD THEREOF

(71) Applicant: UIF (University Industry Foundation), Yonsei University, Seoul (KR)

(72) Inventor: Myeong Kyu Lee, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 362 days.

(21) Appl. No.: 18/380,630

(22) Filed: Oct. 16, 2023

(65) Prior Publication Data

US 2024/0194720 A1    Jun. 13, 2024

(30) Foreign Application Priority Data

Oct. 7, 2022    (KR) ........................ 10-2022-0128757

(51) Int. Cl.
*H10F 39/18* (2025.01)
*H04N 23/11* (2023.01)
*H10F 39/00* (2025.01)

(52) U.S. Cl.
CPC ......... *H10F 39/1847* (2025.01); *H04N 23/11* (2023.01); *H10F 39/016* (2025.01)

(58) Field of Classification Search
CPC .... H10F 77/126; H10F 30/221; H10F 30/222; H10F 39/802; H10F 39/803; H10F 39/193; H10F 39/1843; H10F 39/8053; H10F 39/1825; H10F 39/182; H10F 39/8063; H10F 39/1847; H10F 39/811;
H10F 39/016; H10D 62/84; G01J 5/046; G01J 5/024; G01J 5/0225; G01J 5/20; H04N 25/20; H04N 23/11
USPC .............................................. 257/440; 438/22
See application file for complete search history.

(56) References Cited

U.S. PATENT DOCUMENTS

| | | | | |
|---|---|---|---|---|
| 2010/0187493 | A1* | 7/2010 | Takahashi .......... | H10N 70/8416 |
| | | | | 257/E29.094 |
| 2011/0214736 | A1* | 9/2011 | Lee ...................... | H10F 77/126 |
| | | | | 136/258 |
| 2012/0132804 | A1 | 5/2012 | Lee et al. | |

(Continued)

FOREIGN PATENT DOCUMENTS

| | | |
|---|---|---|
| KR | 10-2011-0100927 A | 9/2011 |
| KR | 10-2012-0059019 A | 6/2012 |
| KR | 10-2018-0026067 A | 3/2018 |

*Primary Examiner* — Didarul A Mazumder
(74) *Attorney, Agent, or Firm* — NSIP Law

(57) ABSTRACT

A multispectral image storage device and a method for manufacturing the same are disclosed. The multispectral image storage device includes: a substrate; an infrared image storage layer including: an amorphous GST (Ge2Sb2Te5) thin-film disposed on the substrate; and at least one crystalline GST thin-film received in the amorphous GST thin-film and having a first thickness from an upper surface of the amorphous GST thin-film, wherein the at least one crystalline GST thin-film has a shape corresponding to a first image; and a visible image storage layer including at least one semiconductor pattern disposed on the infrared image storage layer so as to generate a second image based on light of a visible light wavelength.

15 Claims, 7 Drawing Sheets

(56) References Cited

U.S. PATENT DOCUMENTS

| 2015/0069517 | A1* | 3/2015 | Yang | H10D 84/01 |
| | | | | 257/369 |
| 2018/0069046 | A1 | 3/2018 | Jin et al. | |
| 2022/0406963 | A1* | 12/2022 | Stoeferle | H10H 20/8512 |

* cited by examiner

【FIGURE 1】
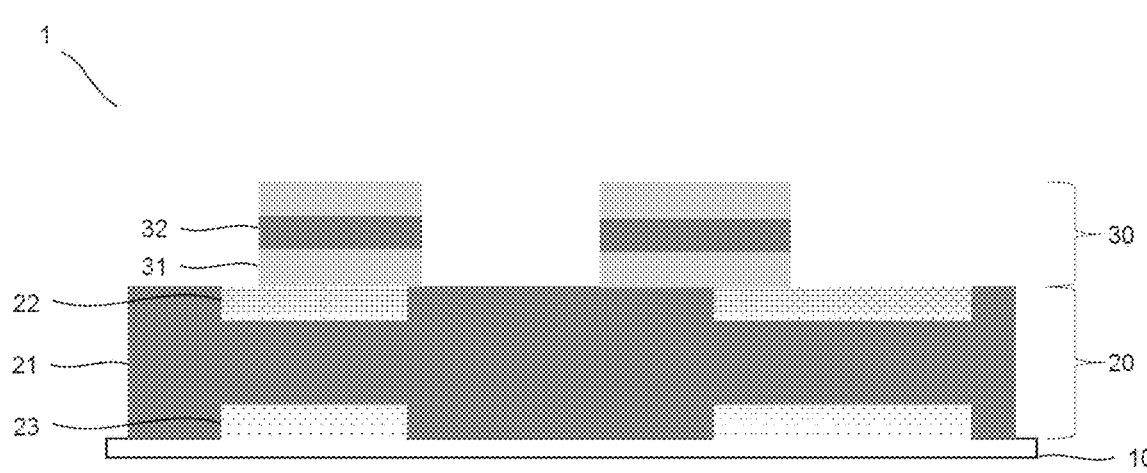

【FIGURE 2】
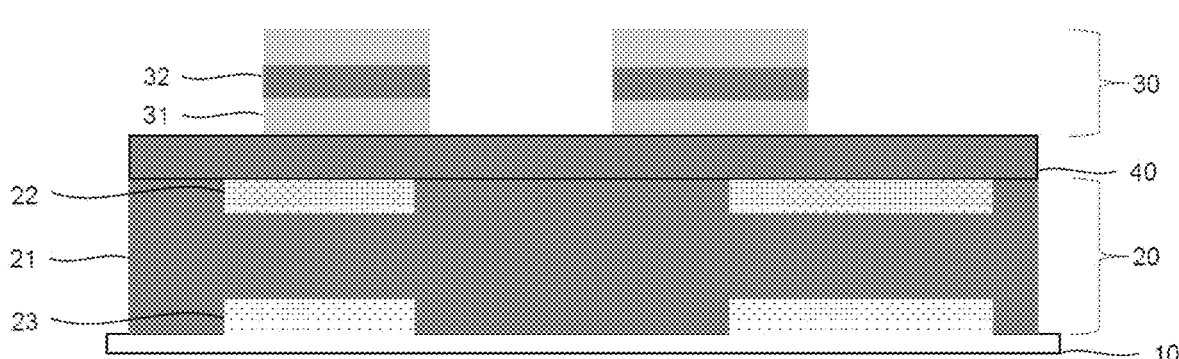

【FIGURE 3】
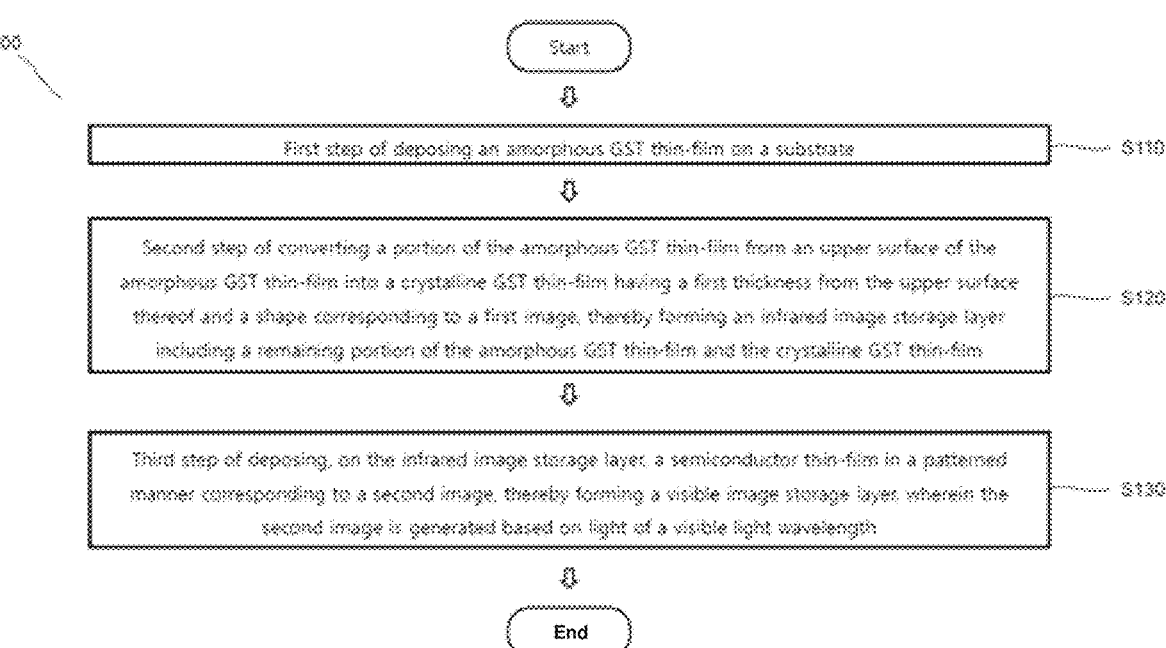

【FIGURE 4】
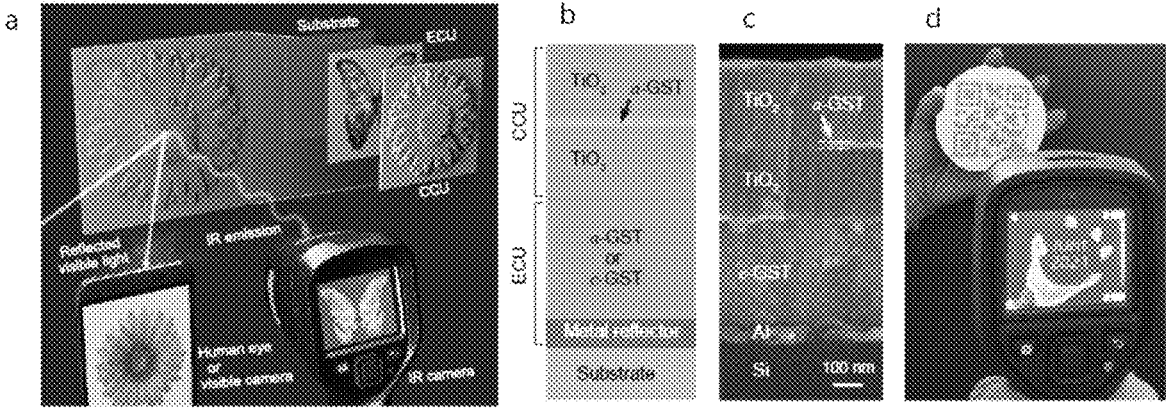

【FIGURE 5】
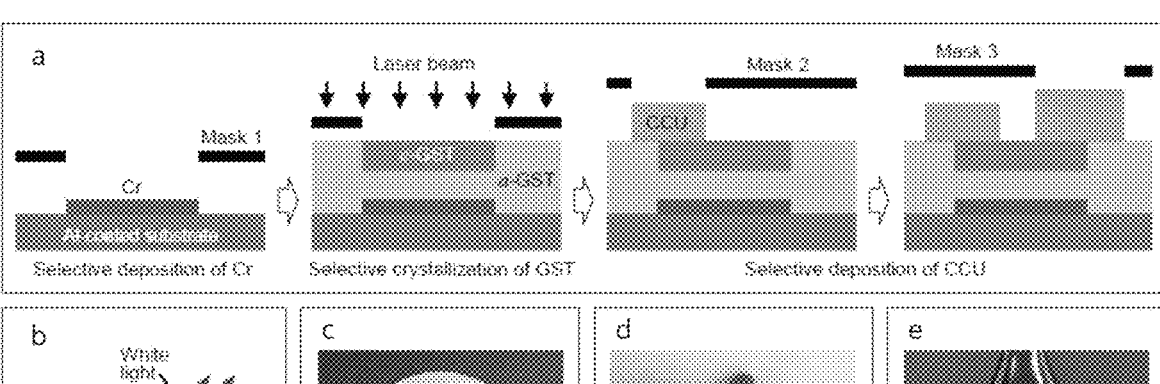
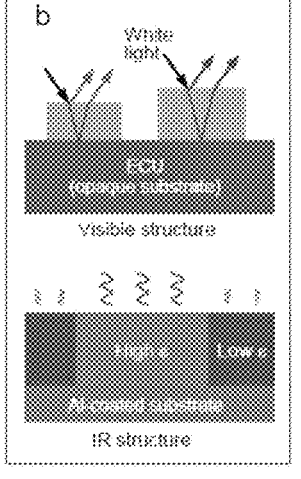
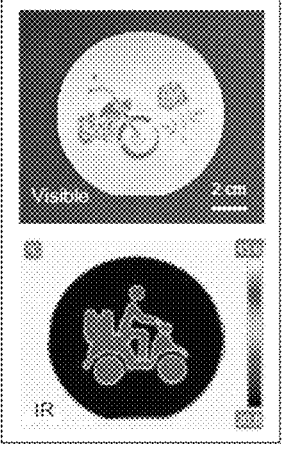
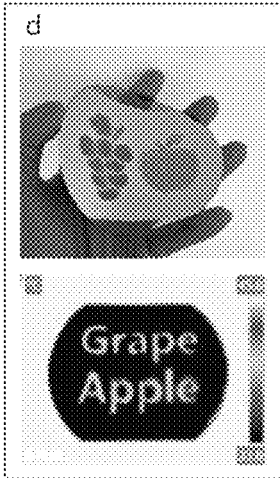
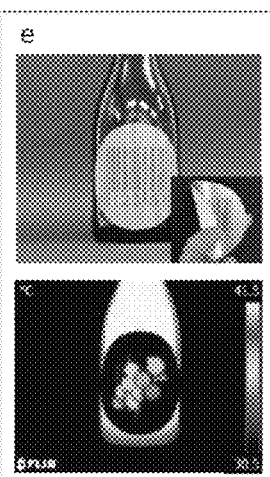

【FIGURE 6】
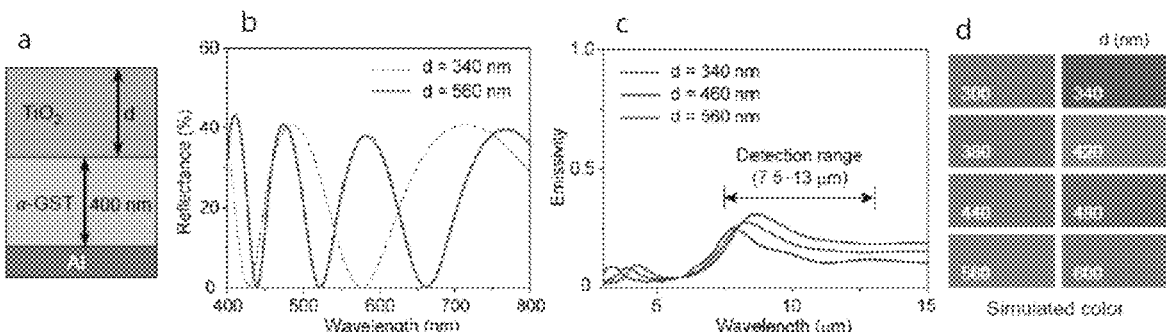

【FIGURE 7】
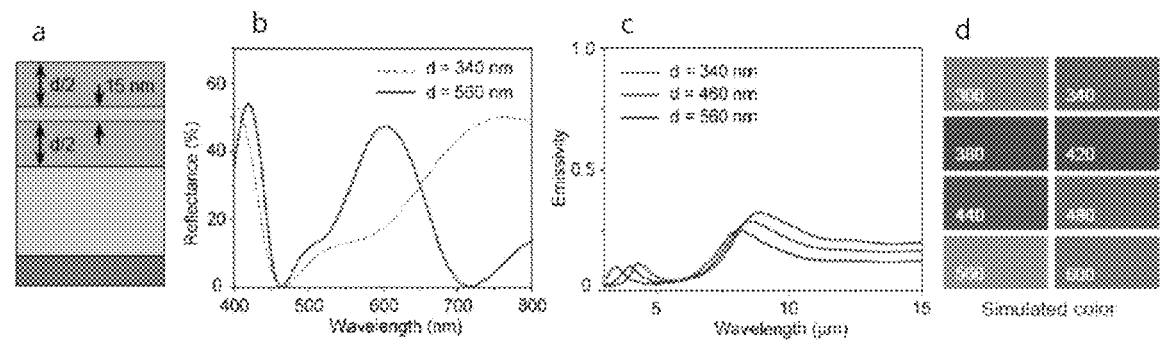

MEDIA FOR STORING MULTISPECTRAL IMAGE AND FABRICATION METHOD THEREOF

DETAILED DESCRIPTION OF INVENTION

Field

The present disclosure relates to a multispectral image storage device and a method for manufacturing the same.

Description of Related Art

In multispectral imaging techniques, an image is captured by measuring light in a specific wavelength range across the electromagnetic spectrum. The human eye only senses red, green, and blue visible light. The multispectral imaging makes it possible to extract additional information that our eyes cannot receive. The multispectral imaging provides image data in both spectral and spatial domains. Wavelengths of light may be filtered and separated or detected using equipment sensitive to specific wavelengths. Multispectral imaging was originally developed for military purposes (e.g., target identification and reconnaissance). Currently, the multispectral imaging techniques are used in precision agriculture, artwork analysis, and environmental monitoring. Advances in optical equipment and remote sensing systems enable monitoring of agricultural crops and air/water pollution.

Despite the above-mentioned advantages of the multispectral imaging, its widespread use has been limited due to the poor spectral selectivity of a material beyond the visible range. Therefore, the development of materials and devices with high spectral selectivity is required. The development of such materials and devices is expected to be used for optical security, anti-counterfeiting technology, safe movement of future mobility self-driving cars, unmanned ships, etc., and construction of a social safety net, including search/rescue fields.

SUMMARY

Problem to be Solved

A purpose of the present disclosure is to provide a multispectral image storage device with high spectral selectivity.

Another purpose of the present disclosure is to provide a method for manufacturing the multispectral image storage device.

Means for Solving Problems

A first aspect of the present disclosure provides a multispectral image storage device comprising: a substrate; an infrared image storage layer including: an amorphous GST (Ge2Sb2Te5) thin-film disposed on the substrate; and at least one crystalline GST thin-film received in the amorphous GST thin-film and having a first thickness from an upper surface of the amorphous GST thin-film, wherein the at least one crystalline GST thin-film has a shape corresponding to a first image; and a visible image storage layer including at least one semiconductor pattern disposed on the infrared image storage layer so as to generate a second image based on light of a visible light wavelength.

In some embodiments of the multispectral image storage device, the infrared image storage layer further includes at least one metal thin-film formed on the substrate and received in the amorphous GST thin-film, wherein the at least one metal thin-film has a second thickness from a lower surface of the amorphous GST thin-film and has in shape corresponding to the first image.

In some embodiments of the multispectral image storage device, the at least one semiconductor pattern includes: vertically arranged at least two layers of a semiconductor thin-film; and an inserted thin-film disposed between adjacent ones of the vertically arranged at least two layers of the semiconductor thin-film, wherein the inserted thin-film includes amorphous GST.

In some embodiments of the multispectral image storage device, the metal thin-film includes chromium (Cr), wherein the semiconductor thin-film includes titanium dioxide (TiO2).

In some embodiments of the multispectral image storage device, a thickness of the inserted thin-film is in a range of 15 to 30 nm.

In some embodiments of the multispectral image storage device, the first thickness is in a range of 80 to 100 nm.

In some embodiments of the multispectral image storage device, a thickness of the infrared image storage layer is in a range of 350 to 400 nm, wherein a thickness of the visible image storage layer is in a range of 200 to 600 nm.

In some embodiments of the multispectral image storage device, the device further comprises a middle thin-film disposed between the infrared image storage layer and the visible image storage layer, wherein the middle thin-film includes amorphous GST, wherein a thickness of the middle thin-film is in a range of 40 to 60 nm.

A first aspect of the present disclosure provides a method for manufacturing a multispectral image storage device, the method comprising: a first step of deposing an amorphous GST thin-film on a substrate; a second step of converting a portion of the amorphous GST thin-film from an upper surface of the amorphous GST thin-film into a crystalline GST thin-film having a first thickness from the upper surface thereof and a shape corresponding to a first image, thereby forming an infrared image storage layer including a remaining portion of the amorphous GST thin-film and the crystalline GST thin-film; and a third step of deposing, on the infrared image storage layer, a semiconductor thin-film in a patterned manner corresponding to a second image, thereby forming a visible image storage layer, wherein the second image is generated based on light of a visible light wavelength.

In some embodiments of the method, the infrared image storage layer is formed to have a thickness of 350 to 400 nm, wherein the visible image storage layer is formed to have a thickness of 200 to 600 nm.

In some embodiments of the method, the first thickness is in a range of 80 to 100 nm, wherein the conversion is performed by irradiating a laser to the amorphous GST thin-film in a shape corresponding to the first image.

In some embodiments of the method, the method further comprises, prior to the first step, disposing, on the substrate, a metal thin-film having a second thickness and a shape corresponding to the first image, wherein the metal thin-film includes chromium.

In some embodiments of the method, the third step includes: deposing a first semiconductor thin-film on the infrared image storage layer; disposing an inserted thin-film including amorphous GST on the first semiconductor thin-film; and deposing a second semiconductor thin-film on the inserted thin-film, wherein each of the first and second semiconductor thin-film includes titanium dioxide.

In some embodiments of the method, the inserted thin-film has a thickness in a range of 15 to 30 nm.

In some embodiments of the method, the method further comprises, prior to the third step, deposing a middle thin-film including amorphous GST on the infrared image storage layer.

Effects of Invention

The multispectral image storage device according to an embodiment of the present disclosure may store the infrared image and the visible image therein independently of each other.

The method for manufacturing the multispectral image storage device according to an embodiment of the present disclosure may manufacture the multispectral image storage device as described above.

BRIEF DESCRIPTION OF DRAWINGS

FIG. 1 and FIG. 2 are diagrams schematically showing a multispectral image storage device according to an embodiment of the present disclosure.

FIG. 3 is a flowchart showing a method for manufacturing a multispectral image storage device according to an embodiment of the present disclosure.

FIG. 4 and FIG. 5 are drawings showing experimental results according to the experimental example in the present disclosure.

FIG. 6 and FIG. 7 are drawings showing simulation results according to the experimental example in the present disclosure.

DETAILED DESCRIPTIONS FOR PRACTICING INVENTION

Hereinafter, embodiments of the present invention will be described in detail with reference to the attached drawings. Since the present invention can be subject to various changes and can have various forms, specific embodiments will be illustrated in the drawings and described in detail in the text. However, this is not intended to limit the present invention to a specific disclosed form, and should be understood to include all changes, equivalents, and substitutes included in the spirit and technical scope of the present invention. While describing each drawing, similar reference numerals are used for similar components. In the attached drawings, the dimensions of the structures are enlarged from the actual size for clarity of the present invention.

The terms used in this application are only used to describe specific embodiments and are not intended to limit the invention. Singular expressions include plural expressions unless the context clearly dictates otherwise. In this application, It should be understood that terms such as "comprise" or "have" are intended to indicate the presence of features, numbers, steps, operations, components, or a combination thereof described in the specification, and does not exclude in advance the presence or addition of one or more other features, numbers, steps, operations, components, or combinations thereof.

Unless otherwise defined, all terms used herein, including technical or scientific terms, have the same meaning as commonly understood by a person of ordinary skill in the technical field to which the present invention pertains. Terms defined in commonly used dictionaries should be interpreted as having meanings consistent with the meanings they have in the context of the relevant technology, and unless explicitly defined in this application, it is not to be interpreted in an idealistic or overly formal sense.

FIG. 1 is a diagram schematically showing a multispectral image storage device according to an embodiment of the present disclosure.

Referring to FIG. 1, a multispectral image storage device 1 according to an embodiment of the present disclosure may include a substrate 10; an infrared image storage layer 20 including an amorphous GST (Ge2Sb2Te5) thin-film 21 disposed on the substrate 10, and at least one crystalline GST thin-film 22 received in the amorphous GST thin-film 21 and having a first thickness from a surface of the amorphous GST thin-film 21, and having a shape corresponding to a first image; and a visible image storage layer 30 including at least one semiconductor pattern disposed on the infrared image storage layer 20 so as to generate a second image based on light of a visible light wavelength.

The substrate 10 is a member on which the layers constituting the device 1 are stacked. Since the substrate 10 may serve as a light reflective layer, the substrate may include at least a material capable of reflecting light from its surface. In one embodiment, the substrate 10 may include a metal in at least the surface thereof. In one embodiment, the substrate 10 may include aluminum (Al) in at least its surface.

The infrared image storage layer 20 refers to a member in which the infrared image is generated based on infrared rays emitted therefrom via types and spatial arrangement of materials constituting the same. The visible image storage layer 30 refers to a member in which the visible image is generated based on visible light reflected therefrom via the types and spatial arrangement of the materials constituting the same.

The amorphous GST thin-film 21 included in the infrared image storage layer 20 may constitute a major portion of the infrared image storage layer 20 and may include a material having a relatively low infrared emission. In the context of the present disclosure, GST may refer to Ge2Sb2Te5. In the context of the present disclosure, "amorphous" means that the arrangement of the chemical species that constitutes the material does not have a crystalline structure at a significant level.

The crystalline GST thin-film 22 may include a material having a relatively high infrared emission compared to that of the amorphous GST thin-film 21. In the context of the present disclosure, "crystalline" means that the arrangement of the chemical species that constitutes the material has a significant crystalline structure at a significant level. The amorphous GST thin-film 21 may be converted to the crystalline GST thin-film 22. This will be described in more detail below.

The present disclosure does not exclude the addition of additional materials to the device 1. For example, continuing to refer to FIG. 1, in one embodiment, the infrared image storage layer 20 may further include one or more metal thin-films 23 formed on a lower surface of the amorphous GST thin-film 21 and having a shape corresponding to the first image, and having a second thickness. The metal thin-film 23 may act as a reflective layer. The metal thin-film 23 may act as a reflective layer for reflecting the infrared rays. An actual amount of infrared emission from an area where the metal thin-film 23 is formed may be measured to be high, and this will become clear based on the following examples.

Continuing to refer to FIG. 1, in one embodiment, the visible image storage layer 30 may include vertically arranged two or more layers of a semiconductor thin-film 31; and an inserted thin-film 32 formed between the vertically arranged two or more layers of the semiconductor thin-film 31 and including amorphous GST. A shape and a color of the visible image of the visible image storage layer 30 may be determined based on its shape and thickness of the semiconductor thin-film 31. Furthermore, the inserted thin-film 32 may act as an absorption layer and suppress reflection of light of a specific wavelength. As a result, a purity of the color of the displayed visible image may be improved, and this will become clear through the following examples.

In one example, infrared rays pass through the visible image storage layer 30 and only an insignificant amount of infrared rays are absorbed thereby. Thus, when the device is observed at a position on top of the visible image storage layer 30, the infrared rays emitted from the infrared image storage layer 20 and a pattern thereof may be observed. Thus, the inventors of the present disclosure discovered that when the device was observed at a position on top of the visible image storage layer 30, the infrared image of the infrared image storage layer 20 and the visible image of the visible image storage layer 30 were displayed simultaneously. This phenomenon will become clear based on the following examples.

The materials and contents of the components of the multispectral image storage device 1 according to the embodiments of the present disclosure are not particularly limited as long as they perform the functions as described above. In one embodiment, the metal thin-film may include chromium Cr. However, the present disclosure is not limited thereto. In one embodiment, the semiconductor thin-film may include titanium dioxide (TiO2). However, the present disclosure is not limited thereto.

The arrangement and shapes of the components of the multispectral image storage device 1 according to the embodiments of the present disclosure are not particularly limited as long as they perform the functions as described above. In one embodiment, a thickness of the inserted thin-film may be in a range of about 15 to 30 nm. In one embodiment, the first thickness may be in a range of about 80 to 100 nm. In one embodiment, a thickness of the infrared image storage layer may be in a range of about 350 to 400 nm. In one embodiment, a thickness of the visible image storage layer may be in a range of about 200 to 600 nm.

In one example, the multispectral image storage device 1 according to the embodiment of the present disclosure may further include an additional member to perform a better function. FIG. 2 is a diagram showing another embodiment of the multispectral image storage device 1 according to an embodiment of the present disclosure.

Referring to FIG. 2, the multispectral image storage device 1 according to the embodiment of the present disclosure may further include a middle thin-film 40 formed between the infrared image storage layer 20 and the visible image storage layer 30, and including amorphous GST.

As described above, when the device was observed at a position on top of the visible image storage layer 30, the infrared image of the infrared image storage layer 20 and the visible image of the visible image storage layer 30 were displayed simultaneously. This is a feature of the device 1 in accordance with the present disclosure. As the visible image storage layer 30 is formed directly on the crystalline GST thin-film 22 of the infrared image storage layer 20, a phenomenon in which the infrared image is displayed in an overlapping manner with the visible image may occur. The middle thin-film 40 may include a material with a low infrared emission, preferably amorphous GST as the same material as that of the amorphous GST thin-film. The middle thin-film 40 is formed between the visible image storage layer 30 and the infrared image storage layer 20. Thus, the above phenomenon may be prevented. The material is not necessarily limited to the amorphous GST as long as the material performs the function of preventing the above phenomenon. Furthermore, in order to perform this function, an appropriate thickness may be selected depending on a type of the material. In one embodiment, the thickness of the middle thin-film may be in a range of about 40 to 60 nm. However, the present disclosure is not necessarily limited thereto. The foregoing will become clear based on the following examples.

As described above, the multispectral image storage device according to the embodiment of the present disclosure may store therein the infrared image and the visible image independently of each other.

FIG. 3 is a flowchart showing a method for manufacturing a multispectral image storage device according to an embodiment of the present disclosure.

Referring to FIG. 3, a method 100 for manufacturing a multispectral image storage device according to an embodiment of the present disclosure may include a first step S110 of deposing an amorphous GST thin-film on a substrate; a second step 120 of converting a portion of the amorphous GST thin-film from an upper surface of the amorphous GST thin-film into a crystalline GST thin-film having a first thickness from the upper surface thereof and a shape corresponding to a first image, thereby forming an infrared image storage layer including a remaining portion of the amorphous GST thin-film and the crystalline GST thin-film; and a third step 130 of deposing, on the infrared image storage layer, a semiconductor thin-film in a patterned manner corresponding to a second image, thereby forming a visible image storage layer, wherein the second image is generated based on light of a visible light wavelength.

In the description of the method 100 for manufacturing the multispectral image storage device according to the embodiment of the present disclosure, descriptions about the same or similar components as or to the those of the multispectral image storage device 1 according to the embodiment of the present disclosure as described above may be replaced with the descriptions about those of the multispectral image storage device 1.

The first step S110 is a step of deposing the amorphous GST thin-film on the substrate, and the amorphous GST thin-film may act as a material with relatively low infrared emission.

The second step S120 is a step of forming the infrared image storage layer and includes a process of converting the portion of the amorphous GST thin-film into the crystalline GST thin-film. In particular, the portion of the amorphous GST thin-film having the first thickness from the surface of the amorphous GST thin-film may be converted into the crystalline GST thin-film. The spatial shape of the crystalline GST thin-film may correspond to the first image. The conversion may be performed by any method known to convert the amorphous GST to the crystalline GST. Non-limiting examples thereof may include heat treatment and laser irradiation. In one embodiment, the conversion may be performed by irradiating a laser to the amorphous GST thin-film in a shape corresponding to the first image.

The third step S130 is a step of forming the visible image storage layer, and includes forming the semiconductor pattern generating the second image based on a target visible light wavelength.

The above steps may be performed to manufacture the above-described multispectral image storage device. The thickness and the shape of the layers and the films may be selected to perform the functions as described in the multispectral image storage device as described above. In one embodiment, the infrared image storage layer may be formed to have a thickness of about 350 to 400 nm. In one embodiment, the visible image storage layer may be formed to have a thickness of about 200 to 600 nm. In one embodiment, the first thickness may be in a range of about 80 to 100 nm. In one embodiment, the conversion of the portion of the amorphous GST thin-film to the crystalline GST thin-film may be achieved by controlling the laser irradiation time and power so that the first thickness is in a range of about 80 to 100 nm.

The method 100 for manufacturing the multispectral image storage device according to embodiments of the present disclosure does not exclude the addition of additional steps. As described in the above-mentioned multispectral image storage device, the metal layer that may act as a reflective layer may be formed between the substrate and the amorphous GST thin-film. To this end, in one embodiment, prior to the first step S110, the method may further include a step of disposing a metal thin-film having a second thickness and a shape corresponding to the first image on the substrate. In a similar manner to the description of the multispectral image storage device, in one embodiment, the metal thin-film may include chromium.

A specific material and a specific forming scheme used in each of the steps of the method 100 for manufacturing the multispectral image storage device according to an embodiment of the present disclosure are not particularly limited as long as they achieve the purpose of each of the steps. In one embodiment, the third step S130 may include first deposing the semiconductor thin-film, and then deposing the inserted thin-film including amorphous GST on the semiconductor thin-film, and then deposing the semiconductor thin-film on the inserted thin-film. The inserted thin-film may perform the same function as that of the inserted thin-film described in the multispectral image storage device as described above. As described above with reference to the above-described multispectral image storage device, the material of the semiconductor thin-film is not particularly limited as long as the semiconductor thin-film performs the above function. In one embodiment, the semiconductor thin-film may include titanium dioxide. Further, as described above with reference to the above-described multispectral image storage device, the thickness of the inserted thin-film may be determined so as to perform the function of the inserted thin-film. In one embodiment, the inserted thin-film may have the thickness in a range of about 15 to 30 nm.

The method 100 for manufacturing the multispectral image storage device according to embodiments of the present disclosure does not exclude the addition of additional steps. In one embodiment, prior to the third step S130, the step of deposing the middle thin-film on the infrared image storage layer may be further included in the method. The material and the thickness of the middle thin-film may be selected so that the infrared image is displayed in a non-overlapping manner with the visible image, as described above with reference to the multispectral image storage device as described above. In one embodiment, the middle thin-film may include the amorphous GST. As discussed above, the method for manufacturing the multispectral image storage device according to an embodiment of the present disclosure may manufacture the multispectral image storage device as described above.

Hereinafter, examples of the present disclosure are described in detail. However, the examples as described below are only a portion of the present disclosure, and the scope of the present disclosure is not limited to the examples below.

Manufacturing of Multispectral Image Storage Device

The substrate was prepared as LG Siltron's silicon substrate, and its thickness was 675 to 700 μm. Prior to deposition, the substrate was soaked in a diluted hydrofluoric solution for 30 seconds to remove an oxide layer therefrom. A PI substrate (Wooyang Chemical, Korea) with a thickness of 125 μm was prepared. A paper substrate was cut from an ordinary paper used for printing.

Al and Cr films were deposited by direct-current magnetron sputtering under argon gas flow 30 sccm flow rate at 2 mTorr operating pressure.

The amorphous GST thin-film (hereinafter referred to as a-GST) was deposited by radio-frequency (RF) sputtering under argon gas flow of 30 sccm flow rate at 3.5 mTorr operating pressure.

The semiconductor thin-film was made of titanium dioxide ($TiO2$). The titanium dioxide thin-film was deposited by RF sputtering under argon gas flow of 30 sccm flow rate at 5 mTorr operating pressure.

Conversion of a-GST to crystalline GST (hereinafter, c-GST) was performed using a Nd:YAG pulsed laser (wavelength=1,064 nm, pulse width=6 ns, repetition rate=10 Hz, and output beam size=0.9 cm). Since the laser has a top-hat intensity profile, a beam homogenizer was not used. The output beam was expanded to 2.2 cm in diameter and spatially modulated via a mask. Only a single pulse with an energy density of approximately 40 mJ/cm2 was irradiated onto the GST thin-film. To record an infrared image, the irradiation was conducted block-by-block. Approximately 20 pulses were used to record the image.

Principle a in FIG. 4 illustrates the principle of the multispectral image storage device in accordance with the present disclosure. The multispectral image storage device is composed of an infrared image storage layer (hereinafter, ECU) and a visible image storage layer (hereinafter, CCU) which overlap each other. The ECU includes a GST film formed on a metal reflective layer. While a-GST has no significant loss in the infrared range of a wavelength of 2.5 to 15 μm, c-GST has strong light absorption in this range. Before forming the CCU, a portion of a-GST may be crystallized into c-GST to form an infrared image. CCU is formed on GST thin-film. CCU may be composed of a titanium dioxide layer or titanium dioxide layers having a-GST disposed therebetween. CCU is a coherent thin-film that reflects only visible light of a specific wavelength. Since the specific wavelength of light reflected depends on the thickness of the CCU, a visible image may be printed by varying the thickness of the CCU. When a-GST is inserted between titanium dioxide layers, the purity of the color that may be rendered may be improved. Since infrared rays transmit through the CCU, there is no significant change in the infrared ray transmittance when the thickness of the CCU changes. On the contrary, the ECU does not transmit visible light therethrough. As a result, visible and infrared images may be recorded independently in a single structure using the ECU and CCU. b in FIG. 4 schematically shows the cross section of the multispectral image storage device, and c in FIG. 4 is an SEM observation of the cross section of the multispectral image storage device. As shown in d in FIG. 4, a visible image of a QR code printed on the substrate is observed with the naked eye. When the device is observed with a thermal imaging camera, an infrared image of "JUNE 2021" may be identified.

Manufacturing Example a in FIG. 5 schematically shows the process of manufacturing the multispectral image of the present disclosure. A chrome layer is deposited on the aluminum coating substrate, and a-GST thin-film is evenly deposited on the chrome pattern. A portion of the deposited a-GST thin-film is converted to c-GST with a Nd:YAG laser to form an infrared image storage layer. Next, the CCU layer is formed thereon. The CCU layer may be a titanium dioxide layer or a stack of titanium dioxide layers including a-GST disposed therebetween. The pattern of the chrome layer and the pattern of the c-GST may be different from each other such that the infrared image and the visible image different from each other may be printed simultaneously. As described above, the CCU may be deposited at various thicknesses, resulting in rendering of different colors. The overall optical properties in the visible light region and the infrared region are different from each other (b in FIG. 5). GST partially reflects or absorbs the visible light. Therefore, the ECU acts as an opaque layer when visible light is incident thereon. The color is rendered by interference between light beams reflected from the air-CCU and CCU-ECU interfaces, respectively, and the thickness of the CCU therefore determines the color of the light. On the other hand, infrared emission is determined by the ECU's internal structure. the c-GST and the chrome layer emit a significant amount of infrared radiation. Since the infrared light emitted in this way passes through the CCU with almost no loss, the visible image and the infrared image may be stored in a single structure independently of each other. c to e FIG. 5 show the visible image (top) and the infrared image (bottom). Furthermore, it may be identified that when the image storage layers are printed on a flexible substrate such as plastic or paper, the device may be bent without breaking or distorting the image.

Finite-Difference-Time-Domain (FDTD) Simulation

Visible light reflectance and infrared emissivity based on the structure were analyzed through finite-difference-time-domain (FDTD) simulation. According to Kirchhoff's law, infrared emissivity is equal to infrared absorbance.

Referring to a in FIG. 6, it shows a case where only 400 nm of a-GST is deposited in the ECU, and only titanium dioxide with a thickness of d is deposited in the CCU. Referring to b in FIG. 6, it may be identified that the reflection spectrum varies depending on d. Multiple reflection peaks may be identified in the visible light range. c in FIG. 6 shows the infrared emissivity spectrum based on d. It may be identified that in the detection range of the infrared sensor (i.e. thermal imaging camera) of 7.5 to 13 μm, the overall emissivity is maintained very low regardless of d. This means that the device's infrared emission amount is almost unaffected by the thickness of the CCU, which determines the color. d in FIG. 6 shows the visible light color based on d. As described above, it may be identified that the purity of the color is somewhat low because multiple reflected light peaks appear in the visible light range.

Referring to a FIG. 7, it shows the case where a-GST layer of 15 nm was added between the titanium dioxide layers of the CCU. Referring to b in FIG. 7, it may be identified that with the addition of the a-GST inserted thin-film, the number of peaks is reduced and reflection peaks other than a target peak are significantly suppressed. Thus, it may be identified that the a-GST inserted film plays a role in absorbing specific visible light wavelengths. Furthermore, referring to c in FIG. 7, it may be identified that the inserted a-GST thin-film has no significant effect on infrared emissivity.

Considering the light distribution within the thin-film, it may be identified that when the a-GST inserted thin-film is inserted into the middle area of the CCU so that the thickness of the upper and lower titanium dioxide semiconductor thin-films are the same or similar to each other, the most significant effect to improve the purity of visible light color may be achieved. Referring to d in FIG. 7, it may be identified that when comparing the color based on d of d in FIG. 7 with that of d in FIG. 6, the purity of visible light color is improved in d in FIG. 7. The a-GST layer inserted into the CCU serves to increase the saturation of the expressed color and has little effect on the amount of infrared emission. The amount of infrared emission from the device varies depending on the internal structure of the ECU. For example, the portion made of the crystalline GST (c-GST) has a higher infrared absorbance and thus higher emissivity than those of the other portions. Therefore, a larger amount of infrared rays are emitted therefrom. Since visible light does not transmit through the ECU, the visible image determined by spatial modulation of the CCU thickness is independent of the infrared image determined by the internal structure of the ECU. FIG. 5 experimentally proves this principle.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

DESCRIPTION OF REFERENCE NUMERALS

1: Multispectral image storage device
10: Substrate
20: Infrared image storage layer
21: Amorphous GST (Ge2Sb2Te5) thin-film
22: Crystalline GST thin-film
23: Metal thin-films
30: Visible image storage layer
31: Semiconductor thin-film
32: Inserted thin-film
40: Middle thin-film
100: Method for manufacturing a multispectral image storage device

The invention claimed is:

1. A multispectral image storage device comprising:

a substrate;

an infrared image storage layer including:

an amorphous GST (Ge2Sb2Te5) thin-film disposed on the substrate; and at least one crystalline GST thin-film received in the amorphous GST thin-film and having a first thickness from an upper surface of the amorphous GST thin-film, wherein the at least one crystalline GST thin-film has a shape corresponding to a first image; and a visible image storage layer including at least one semiconductor pattern disposed on the infrared image storage layer so as to generate a second image based on light of a visible light wavelength.

2. The multispectral image storage device of claim 1, wherein the infrared image storage layer further includes at least one metal thin-film formed on the substrate and received in the amorphous GST thin-film, wherein the at least one metal thin-film has a second thickness from a lower surface of the amorphous GST thin-film and has in shape corresponding to the first image.

3. The multispectral image storage device of claim 2, wherein the at least one semiconductor pattern includes:

vertically arranged at least two layers of a semiconductor thin-film; and an inserted thin-film disposed between adjacent ones of the vertically arranged at least two layers of the semiconductor thin-film, wherein the inserted thin-film includes amorphous GST.

4. The multispectral image storage device of claim 3, wherein the metal thin-film includes chromium (Cr), wherein the semiconductor thin-film includes titanium dioxide (TiO2).

5. The multispectral image storage device of claim 4, wherein a thickness of the inserted thin-film is in a range of 15 to 30 nm.

6. The multispectral image storage device of claim 5, wherein the first thickness is in a range of 80 to 100 nm.

7. The multispectral image storage device of claim 6, wherein a thickness of the infrared image storage layer is in a range of 350 to 400 nm, wherein a thickness of the visible image storage layer is in a range of 200 to 600 nm.

8. The multispectral image storage device of claim 6, wherein the device further comprises a middle thin-film disposed between the infrared image storage layer and the visible image storage layer, wherein the middle thin-film includes amorphous GST, wherein a thickness of the middle thin-film is in a range of 40 to 60 nm.

9. A method for manufacturing a multispectral image storage device, the method comprising:

a first step of deposing an amorphous GST thin-film on a substrate;

a second step of converting a portion of the amorphous GST thin-film from an upper surface of the amorphous GST thin-film into a crystalline GST thin-film having a first thickness from the upper surface thereof and a shape corresponding to a first image, thereby forming an infrared image storage layer including a remaining portion of the amorphous GST thin-film and the crystalline GST thin-film; and a third step of deposing, on the infrared image storage layer, a semiconductor thin-film in a patterned manner corresponding to a second image, thereby forming a visible image storage layer, wherein the second image is generated based on light of a visible light wavelength.

10. The method of claim 9, wherein the infrared image storage layer is formed to have a thickness of 350 to 400 nm, wherein the visible image storage layer is formed to have a thickness of 200 to 600 nm.

11. The method of claim 10, wherein the first thickness is in a range of 80 to 100 nm, wherein the conversion is performed by irradiating a laser to the amorphous GST thin-film in a shape corresponding to the first image.

12. The method of claim 9, wherein the method further comprises, prior to the first step, disposing, on the substrate, a metal thin-film having a second thickness and a shape corresponding to the first image, wherein the metal thin-film includes chromium.

13. The method of claim 9, wherein the third step includes:

deposing a first semiconductor thin-film on the infrared image storage layer;

disposing an inserted thin-film including amorphous GST on the first semiconductor thin-film; and deposing a second semiconductor thin-film on the inserted thin-film, wherein each of the first and second semiconductor thin-film includes titanium dioxide.

14. The method of claim 13, wherein the inserted thin-film has a thickness in a range of 15 to 30 nm.

15. The method of claim 9, wherein the method further comprises, prior to the third step, deposing a middle thin-film including amorphous GST on the infrared image storage layer.

\* \* \* \* \*